(12) United States Patent
Jung et al.

(10) Patent No.: US 11,656,967 B2
(45) Date of Patent: May 23, 2023

(54) METHOD AND APPARATUS FOR SUPPORTING PERSISTENCE AND COMPUTING DEVICE

(71) Applicants: MemRay Corporation, Seongnam-si (KR); KOREA ADVANCED INSTITUTE OF SCIENCE AND TECHNOLOGY, Daejeon (KR)

(72) Inventors: Myoungsoo Jung, Daejeon (KR); Miryeong Kwon, Daejeon (KR); Gyuyoung Park, Daejeon (KR); SangWon Lee, Daejeon (KR)

(73) Assignees: MEMRAY CORPORATION, Seongnam-si (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 114 days.

(21) Appl. No.: 17/166,417

(22) Filed: Feb. 3, 2021

(65) Prior Publication Data
US 2021/0255942 A1    Aug. 19, 2021

(30) Foreign Application Priority Data

Feb. 13, 2020  (KR) .................. 10-2020-0017925
Nov. 3, 2020   (KR) .................. 10-2020-0145403

(51) Int. Cl.
  *G06F 11/00*  (2006.01)
  *G06F 11/30*  (2006.01)
  (Continued)

(52) U.S. Cl.
  CPC ............ *G06F 11/3037* (2013.01); *G06F 1/28* (2013.01); *G06F 1/30* (2013.01); *G06F 9/30047* (2013.01);
  (Continued)

(58) Field of Classification Search
  CPC ............ G06F 11/0703; G06F 11/0706; G06F 11/0721; G06F 11/073; G06F 11/0793;
  (Continued)

(56) References Cited

U.S. PATENT DOCUMENTS 5,317,752 A * 5/1994 Jewett .................. G06F 11/2015
                                                714/24
6,223,293 B1 * 4/2001 Foster ....................... G06F 1/24
                                                713/323
(Continued)

FOREIGN PATENT DOCUMENTS

KR    10-2020-0002581 A    1/2020

OTHER PUBLICATIONS

RISC_V Supervisor Binary Interface Specification, riscv-sbi-doc/riscv-sbi.adoc at master • riscv/riscv-sbi-doc • GitHub, printed Feb. 2, 2021, pp. 1-22.
(Continued)

*Primary Examiner* — Anthony J Amoroso
(74) *Attorney, Agent, or Firm* — Plumsea Law Group, LLC

(57) ABSTRACT

A method of supporting persistence of a computing device is provided. The computing device performs a stop procedure upon power failure. In the stop procedure, the computing device schedules out a running process task, stores a state of the process task to a process control block of a memory module including a non-volatile memory, flushes a cache for the processor, and flushes a pending memory request.

13 Claims, 14 Drawing Sheets

(51) Int. Cl.
*G06F 11/14* (2006.01)
*G06F 12/02* (2006.01)
*G06F 1/30* (2006.01)
*G06F 9/30* (2018.01)
*G06F 9/48* (2006.01)
*G06F 1/28* (2006.01)

(52) U.S. Cl.
CPC ........ *G06F 9/4881* (2013.01); *G06F 11/1441* (2013.01); *G06F 11/3058* (2013.01); *G06F 12/0238* (2013.01)

(58) Field of Classification Search
CPC ............... G06F 11/141; G06F 11/1441; G06F 11/3037; G06F 11/3058; G06F 1/28; G06F 1/30; G06F 9/3004; G06F 9/30047; G06F 9/4881; G06F 9/4843; G06F 9/485; G06F 12/0802; G06F 12/0804; G06F 12/0806; G06F 12/0866; G06F 3/0604; G06F 3/0614; G06F 3/0656; G06F 3/0659; G06F 3/0679
See application file for complete search history.

(56) References Cited

U.S. PATENT DOCUMENTS

| | | | |
|---|---|---|---|
| 10,452,531 | B1 | 10/2019 | Jung et al. |
| 10,579,523 | B2 * | 3/2020 | Ren .................... G06F 16/1865 |
| 11,194,524 | B2 * | 12/2021 | Ramanujan ......... G06F 11/1471 |
| 2006/0248387 | A1 | 11/2006 | Nicholson et al. |
| 2008/0104308 | A1 | 5/2008 | Mo et al. |
| 2014/0297919 | A1 | 10/2014 | Nachimuthu et al. |
| 2014/0304475 | A1 * | 10/2014 | Ramanujan ......... G06F 12/0895 |
| | | | 711/135 |
| 2016/0187959 | A1 * | 6/2016 | Nagarajan ............ G06F 1/3237 |
| | | | 713/324 |
| 2017/0255559 | A1 | 9/2017 | Burstein et al. |
| 2019/0243759 | A1 * | 8/2019 | Stonelake ............ G06F 3/0619 |
| 2020/0004669 | A1 | 1/2020 | Jung et al. |
| 2021/0373951 | A1 * | 12/2021 | Malladi ............... G06F 12/0815 |

OTHER PUBLICATIONS

Brown & Wysocki, "Suspend-to-RAM in Linux," Proceedings of the Linux Symposium, vol. 1, Jul. 23-26, 2008, Ottawa, Ontario, Canada, pp. 39-52.

Park et al., "BIBIM: A Prototype Multi-Partition Aware Heterogeneous New Memory," Computer Architecture and Memory Systems Laboratory (CAMEL), Yonsei University, University of Wisconsin-Michigan, http://camelab.org, pp. 1-7.

ARM®, "AMBA® AXI™ and ACE™ Protocol Specification," ARM IHI 0022D (ID102711) Copyright © 2003, 2004, 2010, 2011 ARM, pp. 1-306.

Krste Asanović et al., "The Rocket Chip Generator," Electrical Engineering and Computer Sciences, University of California at Berkeley, Technical Report No. UCB/EECS-2016-17, http://www.eecs.berkeley.edu/Pubs/TechRpts/2016/EECS-2016-17.html, Apr. 15, 2016, pp. 1-11.

Jonathan Bachrach et al., "Chisel: Constructing Hardware in a Scala Embedded Language," EECS Department, UC Berkeley, {jrb|huy tbvo|richards|yunsup|waterman|rimas|johnw|krste}@eecs.berkeley.edu, DAC 2012, Jun. 3-7, 2012, San Francisco, California, USA. Copyright 2012 ACM 978-1-4503-1199-1/12/06, 52.2, pp. 1212-1221.

* cited by examiner

METHOD AND APPARATUS FOR SUPPORTING PERSISTENCE AND COMPUTING DEVICE

CROSS-REFERENCE TO RELATED APPLICATION

This application claims priority to and the benefit of Korean Patent Application No. 10-2020-0017925 filed in the Korean Intellectual Property Office on Feb. 13, 2020, and Korean Patent Application No. 10-2020-0145403 filed in the Korean Intellectual Property Office on Nov. 3, 2020, the entire contents of which are incorporated herein by reference.

BACKGROUND

(a) Field

The described technology generally relates to a persistence support apparatus and method, and a computing device.

(b) Description of the Related Art

Recently, persistent memory technologies have received significant attention as they can considerably improve the performance of datacenters and high-performance computers. Specifically, in many computing domains, back-end storage is required for recovery from system failures and crashes. As persistent memory can spontaneously and instantaneously recover all memory states, it can eliminate a large number of accesses to the back-end storage as well as associated runtime overheads.

However, the existing persistence mechanisms are limited to make the system fully non-volatile, and introduce significant overhead. For example, system images, including hibernation and sleep, are infeasible to offer orthogonal persistence when the system faces a power failure. For the failure, the hibernation requires serializing the entire system image, which cannot succeed without the assistance of external power sources. On the other hand, checkpoint-restarts introduce serious system overhead due to redundant data dumps. Furthermore, many of checkpoint-restarts are not completely non-volatile, which means that they need to reboot the kernel and exhibit extra latency to detect the exact resumption point.

SUMMARY

An example embodiment provides a persistence support apparatus and method, and a computing device for providing persistence upon power failure.

According to an example embodiment of the present invention, a method of supporting persistence of a computing device including a processor and a memory module including a non-volatile memory is provided. The method includes performing a stop procedure upon power failure. Performing the stop procedure includes scheduling out a running process task, storing a state of the process task to a process control block of the memory module, flushing a cache for the processor, and flushing a pending memory request.

The method may further include performing a go procedure when power is recovered, and performing the go procedure may include scheduling process tasks based on the process control block.

Performing the stop procedure may further include storing a register associated with a program for performing the stop procedure and the go procedure to the memory module.

Performing the go procedure may further include restoring the register from the memory module.

Performing the stop procedure may further include reading peripheral information from a peripheral related memory region, and writing the peripheral information to a device context of the memory module.

The method may further include performing a go procedure when power is recovered, and performing the go procedure may include restoring the peripheral information by reading the device context.

The processor may include a plurality of core tiles including a master tile and a worker tile. Scheduling out the running process task may include scheduling out a process task running on the master tile except a kernel process implementing the stop procedure, and scheduling out a process task running on the worker tile.

Performing the stop procedure may include, after flushing the pending memory request, reporting offline to the master tile and powering off, at the worker tile, and switching a context at the master tile when receiving the offline report from the worker tile.

Switching the context may include raising a system-level exception to switch the context from a kernel to bootloader of a protection mode.

Performing the stop procedure may include, in the protection mode, storing a return address for re-executing a system to the memory module.

Performing the stop procedure may include raising a system-level exception to switch a context from a kernel to bootloader of a protection mode, and executing a first flush instruction for flushing the cache and a second flush instruction for flushing the memory request in the protection mode.

Scheduling out the running process task may include replace the running process task with an idle task.

Performing the stop procedure may include clearing a kernel pointer of referring to the idle task.

The method may further include performing a go procedure when power is recovered, and performing the go procedure may include scheduling process tasks based on the process control block after returning the kernel pointer to an idle task.

Flushing the cache may include flushing the cache in a user-level without checking a memory region of the memory module.

According to another example embodiment, a computing device including a memory module including a non-volatile memory and a processor that performs stop procedure upon power failure by executing instructions stored in the memory module is provided. The processor, in the stop procedure, schedules out a running process task, stores a state of the process task to a process control block of the memory module, flushes a cache for the processor, and flushes a pending memory request.

According to yet another example embodiment, a persistence support apparatus including a scheduler that schedules memory requests a processor of a computing device and a memory controller is provided. The memory controller manages a memory space of a non-volatile memory module used as a system memory of the computing device, and when receiving a first flush instruction from the processor, flushes data and a pending memory request to support persistence between the processor and the non-volatile memory.

The processor may include a RISC-V (reduced instruction set computer five) core tile.

The memory controller may include a buffer to which data of cache lines of the processor are flushed in response to a second flush instruction from the processor.

The memory controller may further include a register that maintains the first flush instruction, and may check wherein there is the first flush instruction by referring to the register.

The memory controller may include a buffer, a memory interface logic for interface with the memory module, and a buffer manager that issues a status-read request to the non-volatile memory module through the memory interface logic when receiving a write request among the memory requests, and stores the write request to the buffer when a target region of the non-volatile memory module is unavailable.

The buffer manager may send the write request to the non-volatile memory module through the memory interface logic when the target region is available.

The non-volatile memory module may include a plurality of memory module, and the memory controller may include a plurality of memory controllers that correspond to the plurality of memory modules, respectively. The scheduler may stripe and/or interleave the memory requests across the plurality of memory controllers.

According to still another example embodiment, a computer program stored in a non-transitory computer-readable medium is provided. The computer program, when executed by a computing device, configures the computing device to execute, upon power failure, scheduling out a running process task, storing a state of the process task to a process control block of a memory module including a non-volatile memory, flushing a cache for a processor of the computing device, and flushing a pending memory request.

DETAILED DESCRIPTION OF THE EMBODIMENTS

Figure 1:
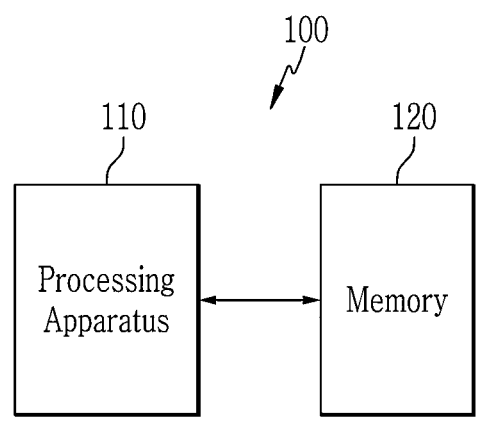
FIG. 1 is a block diagram of a computing device according to an example embodiment.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

As used herein, the singular forms "a", "an" and "the" are intended to include the plural forms as well, unless the context clearly indicates otherwise.

The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

FIG. 1 is a block diagram of a computing device according to an example embodiment. FIG. 1 shows an example of a possible computing device, and a computing device according to an example embodiment may be implemented by various structures.

Referring to FIG. 1, a computing device 100 according to an example embodiment includes a processing apparatus 110 and a memory 120.

The processing apparatus 110 includes a processor that performs various operations (e.g., arithmetic, logic, control, and input/output operations) by executing instructions. The processor may include, for example, a central processing unit (CPU), a microprocessor, or an application processor (AP), and is not limited thereto.

The memory 120 is accessed and used by the processing apparatus 110. In some example embodiments, the memory 120 may be a system memory (main memory) of the computing device. In some example embodiments, the computing device 100 may further include a storage device.

The memory 120 may include a resistance switching memory which is a non-volatile memory. In some example embodiments, the resistance switching memory may include a phase-change memory (PCM) using a resistivity of a resistance medium (phase-change material). In another example embodiment, the resistance switching memory may include a resistive memory using a resistance of a memory device, or a magnetoresistive memory. The PCM, in particular, a phase-change random access memory (PRAM) is described as an example of the resistance switching memory in below example embodiments.

In some example embodiments, the processing apparatus 110 and the memory 120 may operate a persistence apparatus.

Figure 2:
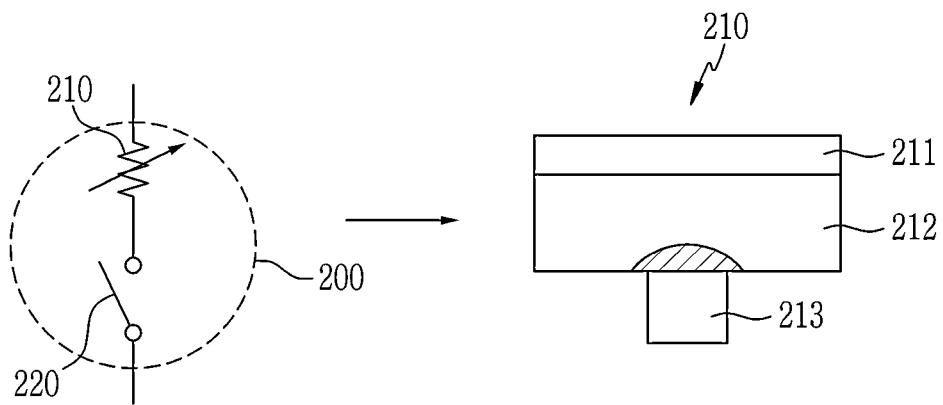
FIG. 2 shows one memory cell in a PRAM.
Figure 3:
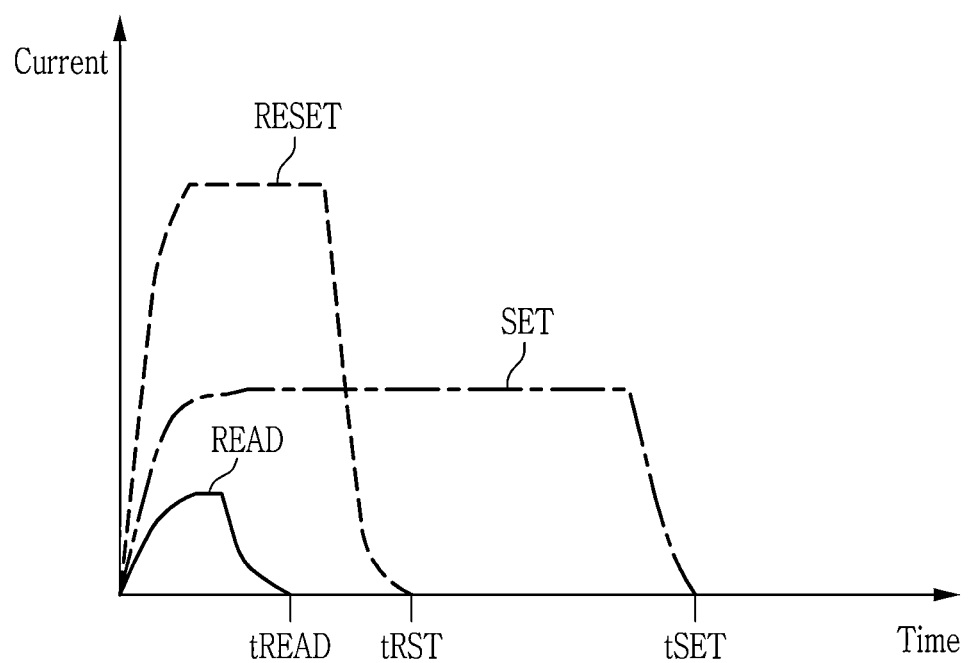
FIG. 3 shows a current applied to a memory cell shown in FIG. 2.
Figure 4:
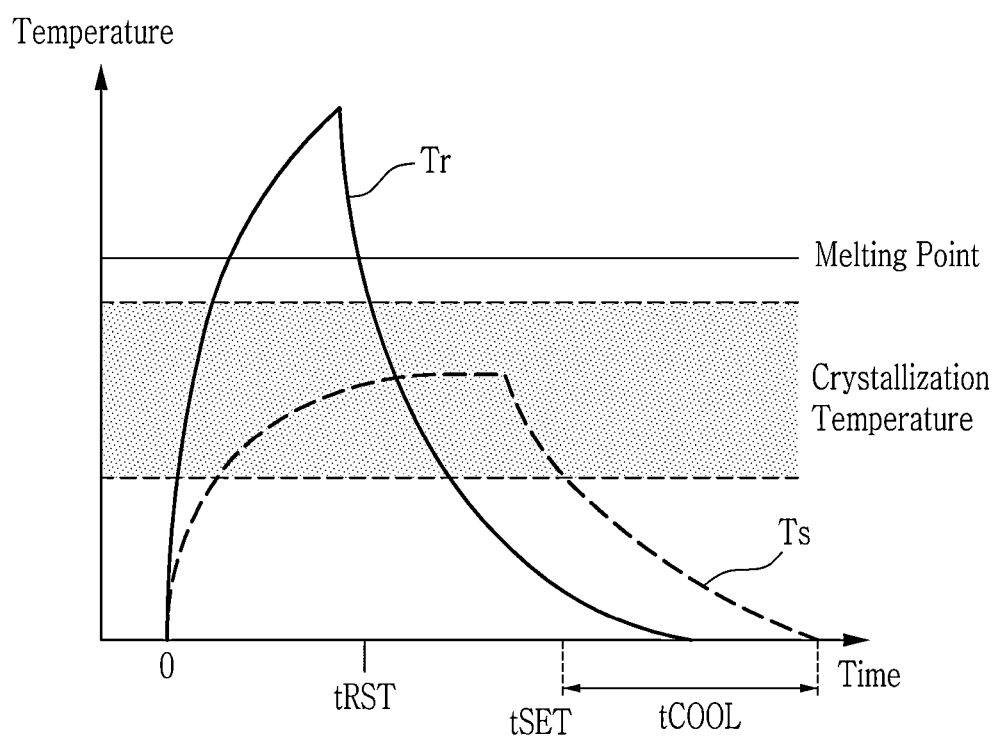
FIG. 4 shows a temperature change when a current shown in FIG. 3 is applied to a memory cell shown in FIG. 2.

Next, an example of a PRAM included in a memory according to an example embodiment is described FIG. 2 shows one memory cell in a PRAM, FIG. 3 shows a current applied to a memory cell shown in FIG. 2, and FIG. 4 shows a temperature change when a current shown in FIG. 3 is applied to a memory cell shown in FIG. 2.

The memory cell shown in FIG. 2 is an example memory cell, and a memory cell of the PRAM according to an example embodiment may be implemented in various forms.

Referring to FIG. 2, a memory cell 200 of a PRAM includes a phase-change element 210 and a switching element 220. The switching element 220 may be implemented with various elements such as a transistor or a diode. The phase-change element 210 includes a phase-change layer 211, an upper electrode 212 formed above the phase-change layer 211, and a lower electrode 213 formed below the phase-change layer 211. For example, the phase-change layer 210 may include an alloy of germanium (Ge), antimony (Sb) and tellurium (Te), which is referred to commonly as a GST alloy, as a phase-change material.

The phase-change material can be switched between an amorphous state with relatively high resistivity and a crystalline state with relatively low resistivity. A state of the phase-change material may be determined by a heating temperature and a heating time.

Referring to FIG. 2 again, when a current is applied to the memory cell 200, the applied current flows through the lower electrode 213. When the current is applied to the memory cell 200 during a short time, a portion, of the phase-change layer 211, adjacent to the lower electrode 213 is heated by the current. The portion (the cross-hatched portion in FIG. 2) of the phase-change layer 211 is switched to one of the crystalline state and the amorphous state in accordance with the heating profile of the current. The crystalline state is called a set state and the amorphous state is called a reset state.

Referring to FIG. 3 and FIG. 4, the phase-change layer 211 is programed to the reset state when a reset pulse RESET with a high current is applied to the memory cell 200 during a short time tRST. If a temperature Tr of the phase-change material reaches a melting point as the phase-change material of the phase-change layer 211 is heated by the applied reset pulse RESET, the phase-change material is melted and then is switched to the amorphous state. The phase-change layer 211 is programed to the set state when a set pulse SET having a lower current than the reset pulse RESET is applied to the memory cell 200 during a time tSET being longer than the time tRST. If a temperature Ts of the phase-change material reaches a crystallization temperature lower than the melting point as the phase-change material is heated by the applied set current SET, the phase-change material is transformed to the crystalline state. Since the reset state and the set state can be maintained when a pulse is applied with a lower current than the set pulse SET or during the shorter time than the set pulse SET, data can be programmed to the memory cell 200.

The reset state and the set state may be set to data of "1" and "0," respectively, and the data may be sensed by measuring the resistivity of the phase-change element 210 in the memory cell 200. Alternatively, the reset state and the set state may be set to data of "0" and "1," respectively.

Therefore, the data stored in the memory cell 200 can be read by applying a read pulse READ to the memory cell 200. The read pulse READ is applied with a low current during a very short time tREAD such that the state of the memory cell 200 is not changed. The current of the read pulse READ may be lower than the current of the set pulse SET, and the applied time of the read pulse READ may be shorter than the applied time tRST of the reset pulse RESET. Because the resistivity of the phase-change element 210 in the memory cell 200 is different according to the state of the phase-change element 210, the state of the memory cell 200, i.e., the data stored in the memory cell 200, can be read by a magnitude of a current flowing to the phase-change element 210 or a voltage drop on the phase-change element 210.

In one example embodiment, the state of the memory cell 200 may be read by a voltage at the memory cell 200 when the read pulse READ is applied. In this case, since the phase-change element 210 of the memory cell 200 has a relatively high resistance in the reset state, the state may be determined to the reset state in a case that the voltage sensed at the phase-change element 210 is relatively high and to the set state in a case that the voltage sensed at the phase-change element 210 is relatively low. In another example embodiment, the state of the memory cell 200 may be read by an output current when a voltage is applied to the memory cell 200. In this case, the state may be determined to the reset state in a case that the current sensed at the phase-change element 210 is relatively low and to the set state in a case that the current sensed at the phase-change element 210 is relatively high.

As writing data is practically a sequence of reset and set processes in the PRAM, a write operation is much slower than a read operation by the reset pulse having the longer applied time.

Figure 5:
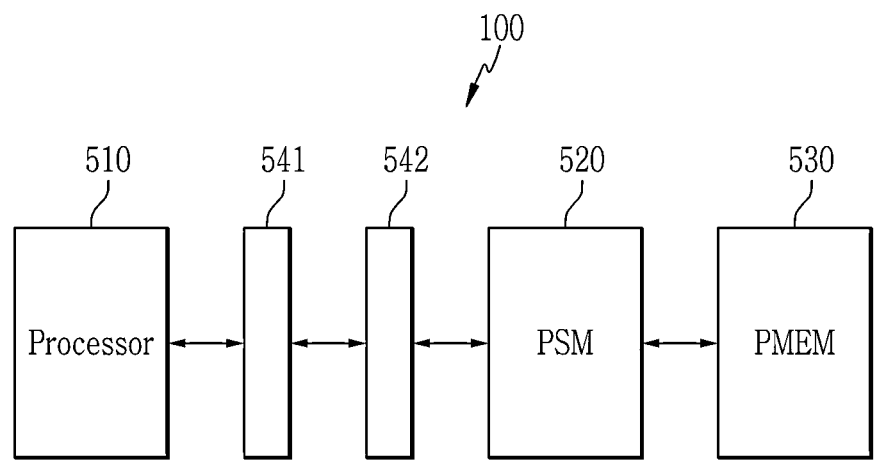
FIG. 5 is a drawing showing a persistence apparatus according to an example embodiment.

FIG. 5 is a drawing showing a persistence apparatus according to an example embodiment.

Referring to FIG. 5, a persistence apparatus 500 includes a processor 510, a persistence support module (PSM) 520 and a memory module 530. The persistence apparatus 500 may further include buses 541 and 542 connecting the processor 510 and the persistence support module 520. In some example embodiments, the buses 541 and 542 may include a system bus 541 connected to the processor 510 and a memory bus 542 connected to the persistence support module 520. In this case, the system bus 541 and the memory bus 542 are connected to each other.

In some example embodiments, the processor 510 may include a plurality of core tiles. In one example embodiment, the core tiles may include RISC-V (reduced instruction set computer five) core tiles In some example embodiments, the system bus 541 may include a TileLink-based cache coherent system bus.

The persistence apparatus 500 may introduce the persistence support module 520 instead of DRAM-related components such as a DRAM (dynamic random access memory) controller and an NMEM (near memory cache) controller to be connected to the system bus 541.

In some example embodiments, the persistence support module 520 may be connected to the processor 510 through the memory bus 542. In one example embodiment, the memory bus 542 may include a burst mode memory bus. In some example embodiments, the persistence support module 520 may be connected to the memory module 530 through an interface and a physical layer (PHY) of the interface. In one example embodiment, the interface may include a DDR (double data rate) interface.

The persistence support module 520 may convert load/store requests, i.e., write/read requests from the processor 510 to non-volatile memory (e.g., PRAM) requests.

The memory module 530 is formed with a non-volatile memory for persistence. Hereinafter, the memory module 530 is referred to as a persistence memory module (PMEM). In some example embodiments, the non-volatile memory may be a resistance-based memory. In one example embodiment, the resistance-based memory may be a PRAM.

Next, a persistence processing apparatus according to example embodiments is described with reference to FIG. 6 and FIG. 7.

Figure 6:
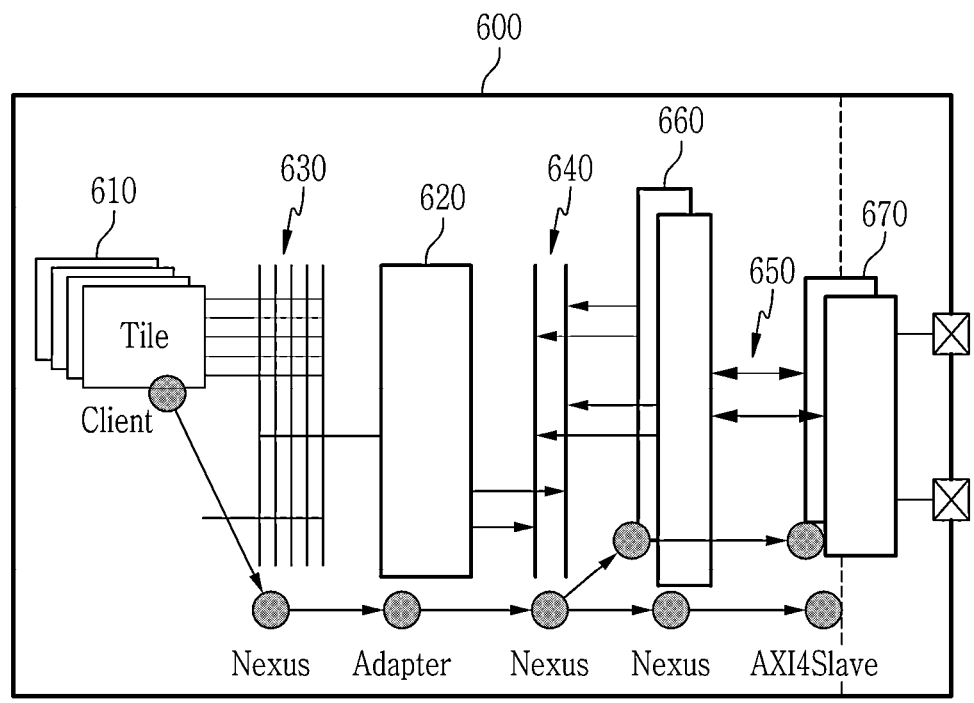
FIG. 6 is a drawing showing a persistence processing apparatus according to an example embodiment.
Figure 7:
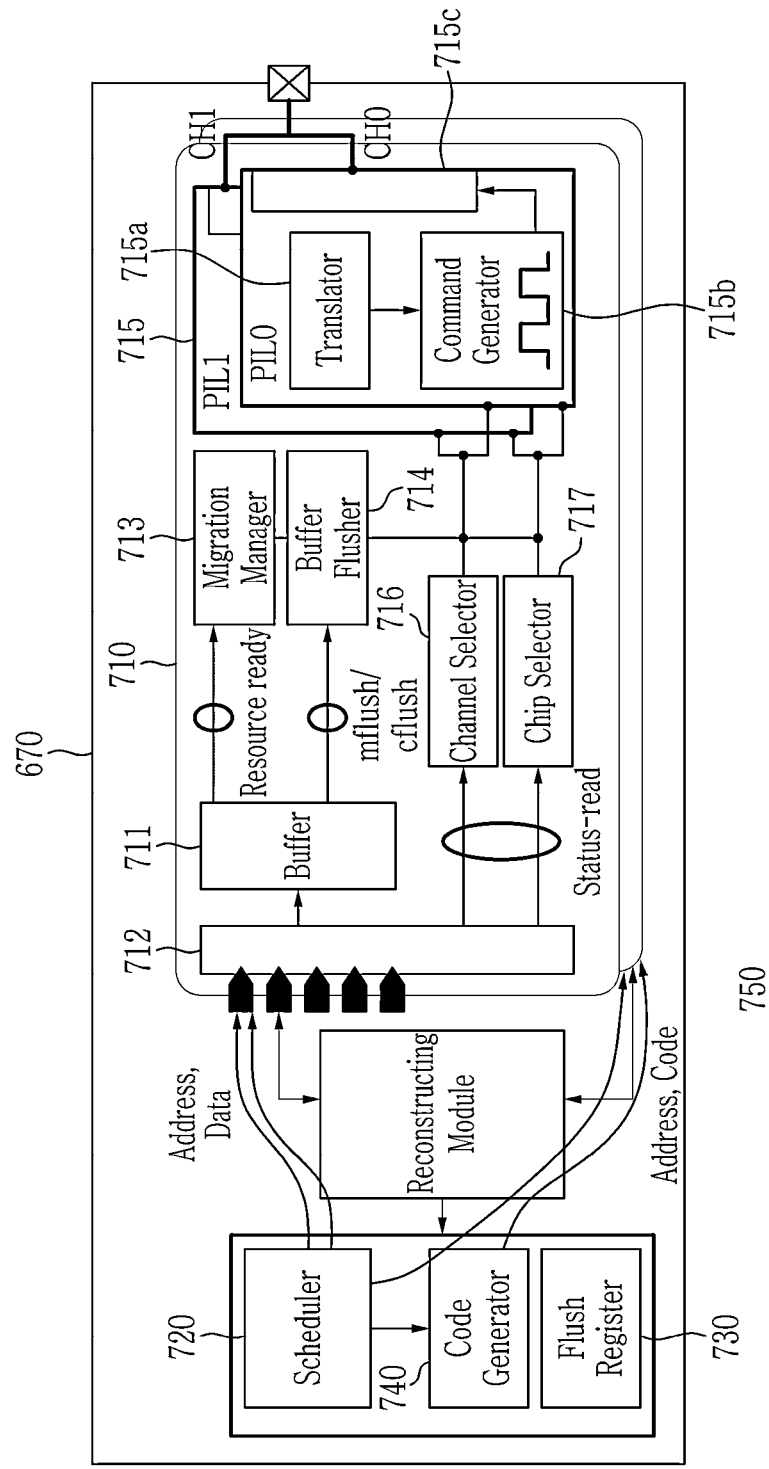
FIG. 7 is a drawing showing persistence support module according to an example embodiment.

FIG. 6 is a drawing showing a persistence processing apparatus according to an example embodiment, and FIG. 7 is a drawing showing persistence support module according to an example embodiment.

Referring to FIG. 6, a persistence processing apparatus 600 includes a processor 610 and a persistence support module 670.

The processor 610 may include a plurality of core tiles. In one example embodiment, each core tile may include an RISC-V core tile. For example, the processor 610 may include four different RISC-V core tiles. Each core tile 610 includes a cache (e.g., an L1 (level 1) cache or L2 (level 2)

cache). In some example embodiments, flush instructions (cflush and mflush) that can flush data stored in the cache of the core tile 610 and memory requests, respectively.

Referring to FIG. 6 again, the plurality of core tile 610 may be connected to a system bus 630. The system bus 630 may be called a shared system bus since it is shared by the core tile 610. In some example embodiments, the system bus 630 may include read and write bus channels.

In some example embodiments, the persistence processing apparatus 600 may further include a broadcast hub 620 to guarantee cache coherence. The broadcast hub 620 may implement an MSI (modified, shared, invalid) cache coherence protocol by using remaining bus channels of the system bus 630. The broadcast hub 620 may be connected to the core tiles 610 through the system bus 630.

In some example embodiments, bus channels of the system bus 630 may be routed to a memory bus 640. In some example embodiments, the persistence processing apparatus 600 may further include a converter module 660 that converts a protocol of the memory bus 640 into a protocol of an interface 650 used to connect the persistence support module 670 to the core tiles 610. In one example embodiment, the interface 650 may include an AXI (advanced extensible interface), for example, an AXI4.

In some example embodiments, the system bus 630 may use a TileLink that is a chip-scale interconnect standard.

TileLink has three types of interconnect including TileLink-Cached (TL-C) and two types of TileLink-Uncached (TL-U). The two types of TL-U include TileLink-Uncached Lightweight (TL-UL) and TileLink-Uncached Heavyweight (TL-UH). The TL-C bus employs a plurality of link channels that may be used for cache coherence management, and the TL-UL and TL-UH buses reduce the number of channels by removing coherence-related channels. Both the TL-UL and TL-UH buses may serve conventional reads and writes, but the TL-UH bus may serve additional functions, such as atomic operations (e.g., conditional-store), hint (e.g., prefetching), and burst reads/writes. Nodes may be redefined into a client, nexus, and adapter in TileLink. While the client node may only exhibit output edges, the nexus and adapter nodes may have both input and output edges. The adapter node may have two edges, one for its input and another for its output. In contrast, the nexus node may exploit a various number of input/output edges.

In one example embodiment, the system bus 630 may include five bus channels. In this case, the system bus 630 may include two read and write bus channels implemented by the TL-U. The broadcast hub 620 may implement MSI cache coherence protocol using three remaining bus channels in the system bus 630. The three bus channels may be routed to the memory bus 640 that has two link channels but support burst request operations.

When the system bus 630 uses the TileLink and the interface 650 is the AXI4, the converter module 660 may include a converter module (TileLinkToAXI4) that converts the TileLink to the AXI4.

In some example embodiments, the persistence processing apparatus 600 may be composed by a DAG (direct acyclic graph) as shown in FIG. 6. In this case, the core tiles 610 may be client nodes. Since a nexus node can have asymmetric input and output edges, the system bus 630, the memory bus 640, the interface 650, and the converter module 660 may be nexus nodes, but the broadcast hub 620 may be an adaptor node. Edges of the core tiles 610 may be forwarded to the nexus node forming the system bus 630. The persistence support module 670 may be a slave of the interface 650, for example, an AXI4 slave (AXI4Slave).

Upper the broadcast hub 620, interconnect may be handled by the TL-C, but under the broadcast hub 620, interconnect may be handled by the TL-UH. Considering the processor-side cache line size (e.g., 64B), the TL-UH may be composed to deliver eight 64-bit based messages in a burst period. The persistence support module 670 may be connected to the TL-UH nexus as a black box.

Referring to FIG. 7, in some example embodiments, a persistence support module 670 may include a memory controller 710 that interfaces with a persistence memory module (e.g., 530 of FIG. 5) and manages a memory space of the persistence memory module and a scheduler 720 that schedules memory requests. In some example embodiments, the persistence support module 670 may include a plurality of memory controllers 710. When the persistence memory module includes a plurality of memory modules (e.g., dual in-line memory modules (DIMMs)), each memory controller 710 may be provided per memory module.

In some example embodiments, the persistence support module 670 may further include a flush register 730 for a persistence operation. The flush register 730 may maintain an instruction (mflush) for flushing pending memory requests. The memory controller 710 may refer to the flush register 730 per memory service, and if there is the mflush instruction, the memory controller 710 may suspend incoming memory requests and flush pending memory requests (e.g., all pending memory requests) so as to be served from the persistence memory module.

The scheduler 720 may stripe and/or interleave memory requests across the memory controllers 710, thereby reducing resource conflicts at a PRAM-level. When the memory requests are write (i.e., store) requests, the scheduler 720 may deliver data and addresses of the memory requests to the persistence memory module through the memory controller 710 according to the striped and/or interleaved memory requests. When the memory requests are read requests, the scheduler 720 may read data of the memory requests from the persistence memory module through the memory controllers 710.

On the other hand, write latency of the PRAM is longer than read latency by 110~120× at a processor-side viewpoint. Since the number of reads (loads) is greater than that of writes (stores) in most applications, it may be important to make reads a non-block service against reads. In some example embodiments, the persistence support module 670 may further include a code generator 740 and a reconstructing module 750. When a memory request is a write request, the scheduler 720 may deliver data to the code generator 740, and the code generator 740 may code the data to generate a non-blocking code. Then, the scheduler 720 may deliver the data and the non-blocking code to the persistence memory module through the memory controller 710. In some example embodiments, the persistence memory module may include a PRAM package designated for non-blocking codes. In this case, the scheduler 720 may deliver the non-blocking code and an address to the memory controller 710 corresponding to the memory module including the PRAM package designated for non-blocking codes.

In some example embodiments, the code generator 740 may divide the data of the write request into a plurality of sub-data, and generate the non-blocking code by coding the plurality of sub-data. In this case, the plurality of subdata and non-blocking code may be stored in different PRAM packages, respectively. In one example embodiment, when the code generator 740 divides the data into two subdata, the two subdata may be stored in the two PRAM packages, respectively, and the non-blocking code may be stored in another PRAM package (e.g., the PRAM package designated for non-blocking code).

For example, when the data is 64-byte data, the code generator 740 may divide the write data into two 32-byte sub-data. The code generator 740 may generate the non-blocking code by coding the two sub-data. In one example embodiment, an exclusive OR (XOR) operation may be used as a coding scheme for generating the non-blocking code. In this case, when 64-byte original data are divided into two 32-byte sub-data DATA_A and DATA_B, a bitwise XOR operation is performed on the 32-byte sub-data DATA_A and DATA_B so that a 32-byte non-blocking code can be generated. For example, the code generator 740 may divide the data of "001011100110" into the subdata of "001011" and the subdata of "100110", and generate the non-blocking code of "101101" by the XOR operation of "001011" and "100110". The code generator 740 may use coding schemes other than the XOR operation to generate the non-blocking code. In an example, an error correction coding (ECC) may be used as a coding scheme for generating the non-blocking code. For example, a parity code may be generated as the non-blocking code by low density parity check (LDPC) coding.

When the memory request is a read (i.e., load) request, the scheduler 720 reads data from the persistence memory module through the memory controller 710. The memory controller 710 may provide target data of the read request by reading a plurality of subdata corresponding to the target data from a plurality of PRAM package, respectively. As there is a PRAM package used for a service of another memory request among the plurality of PRAM packages, that is, a conflicted PRAM package, the sub-data may not be read from the conflicted PRAM package until the service of another memory request is completed. In this case, the memory controller 710 may read the non-blocking code corresponding to the target data from the designated PRAM package, and the reconstructing module 750 may recover the subdata stored in the conflicted PRAM PRAM package based on the non-blocking code and the subdata read from the non-conflicted PRAM packages. For example, when the target data is divided into two subdata DATA_A and DATA_B) and there is a conflict in the PRAM package in which the subdata DATA_B is stored, the reconstructing module 750 may recover the subdata stored in the conflicted PRAM package based on the subdata DATA_A read from the non-conflicted PRAM package and the non-blocking code. For example, when original data of "001011100110" stored with being divided into DATA_A of "001011" and DATA_B of "100110", DATA_B of "100110" can be recovered by an XOR operation of DATA_A and the non-blocking code.

In some example embodiments, the non-blocking read service may use contents disclosed in U.S. Pat. No. 10,452,531.

Since the processor waits for write completion only if there are flush instructions (mflush and cflush), the write latency may be tolerable. However, if multiple writes are requested for a specific region, it may increase latency due to a conflict. In some example embodiments, each memory controller 710 may provide a non-blocking write service. To this end, the memory controller 710 may include a buffer 711, a buffer manager 712, a migration manager 713, a buffer flusher 714, and a memory interface logic 715. In some example embodiments, to increase memory-level parallelism, two memory channels CH0 and CH1 may allocated per memory module of the persistence memory module. In this case, each memory controller 710 may include two memory interface logics PIL0 and PIL1 that correspond to the two memory channels CH0 and CH1, respectively. Each memory interface logic 715 may operate independently for a corresponding channel.

The buffer (e.g., a row buffer) 711 may store data corresponding to write requests and operate as a cache. In some example embodiments, the buffer may be implemented by a block RAM (BRAM). When the memory controller 710 receives a write request, the buffer manager 712 may issue a status-read request to a target PRAM package of the persistence memory module via the memory interface logic 715. When the target PRAM package is available (i.e., does not conflict with services of other memory requests), the buffer manager 712 may send the write request to the target PRAM package through the memory interface logic 715.

When the target PRAM package is unavailable, the buffer manager 712 may enqueue the write request into the buffer 711. In some example embodiments, when the target PRAM package is available as a result of the buffer manager 712 issuing the status-read request to the target PRAM package of the persistence memory module, the migration manager 713 may send the write request stored in the buffer 711 to the target PRAM package through the memory interface logic 715. In some example embodiments, when the flush instructions (mflush and cflush), the buffer flusher 714 may flush requests stored in the buffer to the target PRAM packages.

In some example embodiments, the memory interface logic 715 may include a register and expose the register to the memory controller 710. The register may include a register for latching a type of an incoming request, a register for latching a write content, and a register for latching a read content. The memory interface logic 715 may include a translator 715a that generates a PRAM command used for communicating with the target PRAM package based on the register. The memory interface logic 715 may further include a command generator 715b that handles memory timing to deliver the PRAM command to the PRAM package, and the PRAM command may be executed according to the memory timing of the command generator 715b. The memory interface logic 715 may further include a PHY 715c that converts a digital signal associated with the PRAM command to an analog signal for the communication.

In some example embodiments, the memory controller 710 may further include a channel selector 716 and a chip selector 717 to select the target PRAM package. When the scheduler 720 stripes and/or interleaves memory requests, the channel selector 716 may select a channel corresponding to each subdata of the memory request, and the chip selector 717 may select the target PRAM package from among PRAM packages included in the selected channel.

In some example embodiments, the persistence support module 670 may expose read and write interfaces of the memory controllers 710 to core tiles (e.g., 610 of FIG. 6) over a plurality of input/output (I/O) ports. In one example embodiment, the I/O ports may include five I/O ports (e.g., AXI4 I/O ports). In this case, two I/O ports for data and address channels may be allocated to a read path, and two I/O ports for data and address channels may be allocated to a write path. One I/O port may be allocated as a response channel for writes in order to check up written states.

Next, a persistence memory module according to example embodiments is described with reference to FIG. 8 to FIG. 11.

Figure 8:
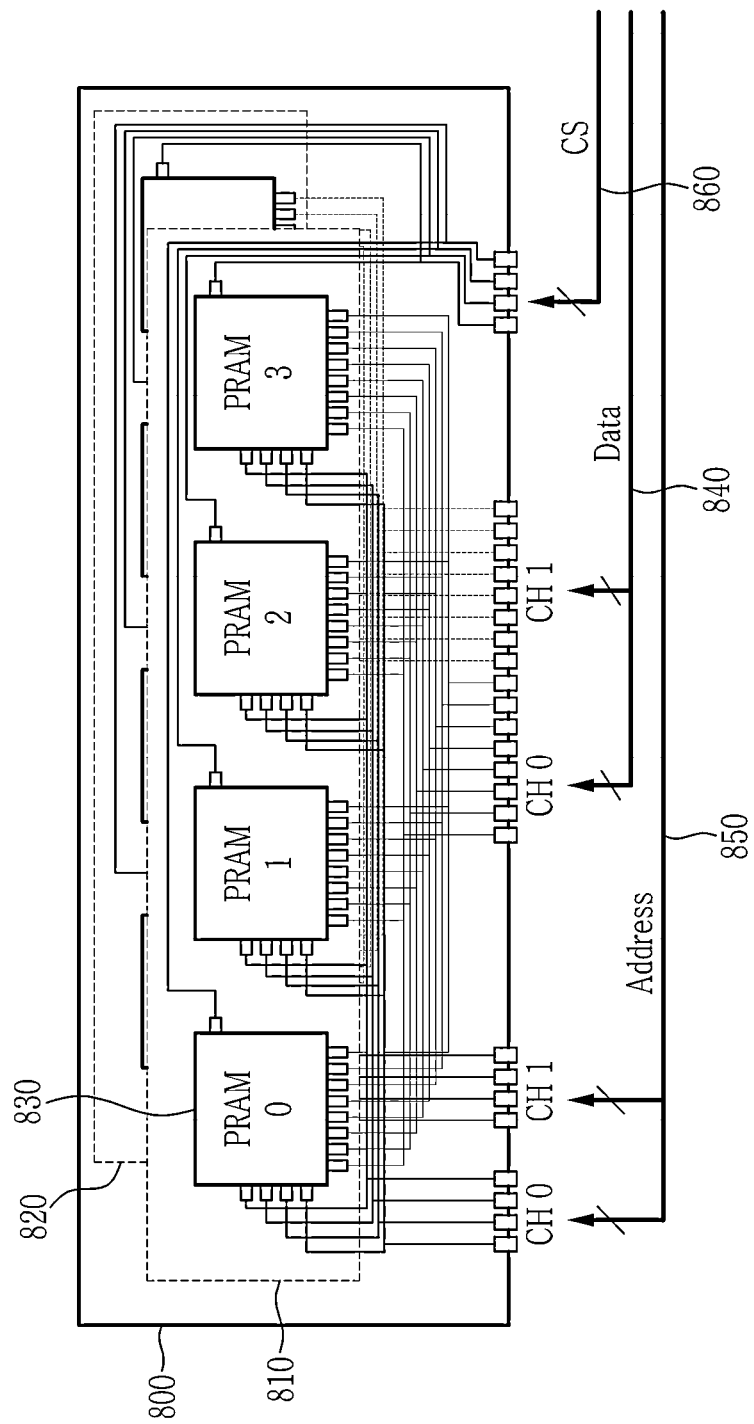
FIG. 8 and FIG. 9 are drawings showing a persistence memory module according to an example embodiment.
Figure 9:
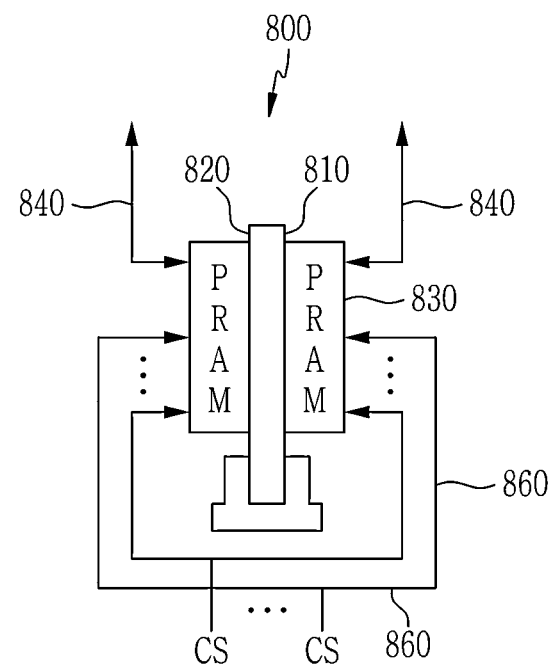

FIG. 8 and FIG. 9 are drawings showing a persistence memory module according to an example embodiment.

Referring to FIG. 8 and FIG. 9, a persistence memory module includes a plurality of PRAM packages 830. In some example embodiments, the PRAM package may be a PRAM chip. In some example embodiments, the persistence memory module may use a DIMM (dual in-line memory module. In this case, a plurality of PRAM packages 830 may be formed on each of a front-end 810 and a back-end 820 of a printed circuit board (PCB). For example, four PRAM packages 830 may be formed on each of the front-end 810 and the back-end 820 of the PCB so as to form eight PRAM packages. For convenience, in FIG. 8, the front-end 810 and the back-end 820 are shown in the same direction.

In each side of the PCB, the PRAM packages 830 are grouped as a channel and share a data signal wire 840. In some example embodiments, the PRAM packages (e.g., four PRAM packages) 830 form on the front-end 810 of the PCB may be grouped by a channel CH0, and the PRAM packages (e.g., four PRAM packages) 830 form on the back-end 812 of the PCB may be grouped by another channel CH1. The data signal wires 840 may be individually allocated for each channel, and address signal wires 850 may be mapped to DDR (double date rate) pins in the same manner In some example embodiments, a 16-bit data signal wire may be used as the data signal wire 840. Accordingly, the persistence memory module may operate with a persistence processing apparatus over a 32-bit data bus, and the persistence processing apparatus may perform burst I/O handling to deliver a cache-line eviction to the persistence memory module over an interface. In some example embodiments, a 10-bit address signal wire may be used as the address signal wire 850.

In each side of the PCB, the PRAM packages 830 may be grouped as a channel and share the data signal wire 840 and the address signal wire 850, but a chip selection (CS) wire may be exclusively introduced for each PRAM package 830. For example, when the four PRAM packages 830 are formed on each side, four CS pins may be provided. In some example embodiments, each CS pin may be connected with two PRAM packages 830 in the front-end 810 and the back-end 820 to improve parallelism.

In some example embodiments, a plurality of CS wires 860 may spread out across different PRAM packages 830 based on a channel offset. In this case, a cache-line eviction may be split into two evictions, and the two evictions may be served in parallel across two different PRAM packages 830 having the same channel offset.

In some example embodiments, the persistence memory module may include a plurality of memory modules (e.g., DIMMs).

Next, a method of serving incoming requests in parallel in a persistence memory module including a plurality of memory modules is described with reference to FIG. 10 and FIG. 11.

Figure 10:
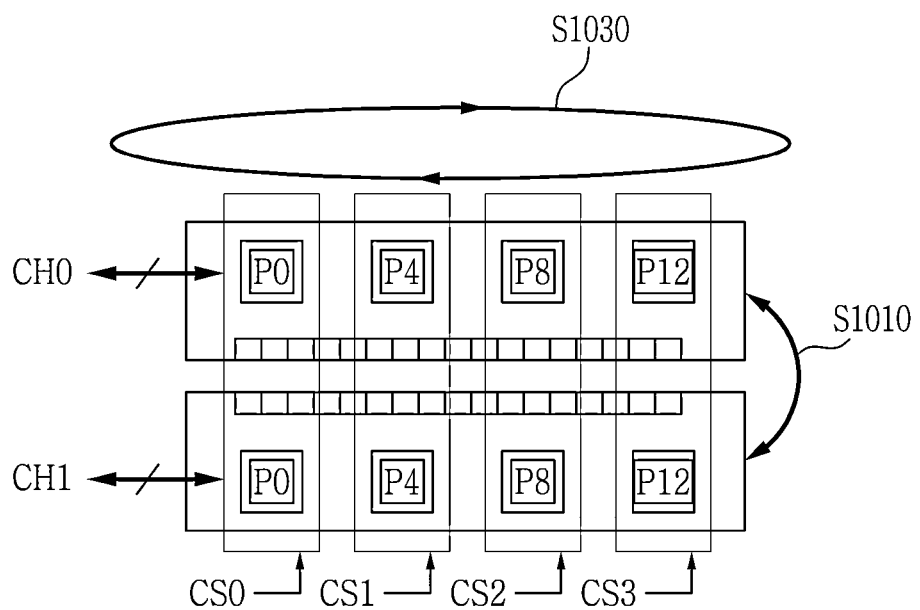
FIG. 10 and FIG. 11 are drawings showing parallelism of memory requests in a persistence memory module according to example embodiments.
Figure 11:
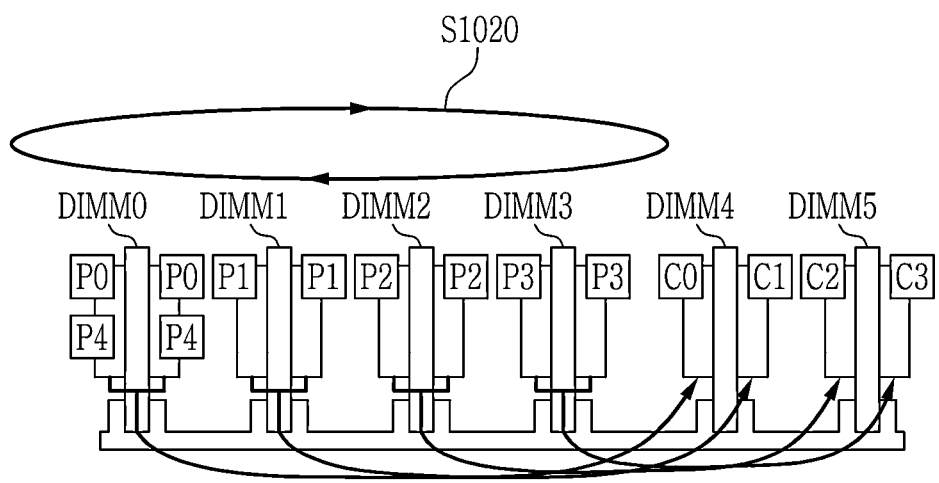

FIG. 10 and FIG. 11 are drawings showing parallelism of memory requests in a persistence memory module according to example embodiments. For convenience, it is shown in FIG. 10 and FIG. 11 that a persistence memory module includes six DIMMs, and four DIMMs are allocated for data and two DIMMs are allocated for non-blocking codes among the six DIMMs.

Referring to FIG. 10, in some example embodiments, since CS wires are separated across different PRAM packages, incoming memory requests may be stripped and served over two channels (S1010). This is called dual-channel striping. Further, in some example embodiments, when a plurality of memory modules (e.g., DIMMs, hereinafter "DIMMs") are provided in a persistence memory module, as shown in FIG. 11, the memory requests may be stripped over the DIMMs (S1020). This is called inter-DIMM striping.

Furthermore, in some example embodiments, as shown in FIG. 10, the memory requests may be sequentially in a plurality of PRAM packages within the DIMM (S1030). This is called intra-DIMM interleaving.

In one example embodiment, sequential incoming memory requests may be served as the followings.

Referring to FIG. 10 and FIG. 11, a memory controller may stripe an incoming memory request across the two PRAM packages in parallel (S1010). For example, the memory controller may stripe the memory request on the PRAM packages P0, of two channels CH0 and CH1, selected by CS0 of DIMM0 among the plurality of DIMMs. When a subsequent memory request is received, the memory controller may stripe the memory request on the DIMM having a next offset among the plurality of DIMM (S1020). For example, the memory controller may stripe the subsequent memory request on the PRAM packages P1 selected by CS0 of DIMM1 among the plurality of DIMMs, stripe another subsequent memory request on the PRAM packages P2 selected by CS0 of DIMM1 among the plurality of DIMMs, and stripe yet another subsequent memory request on the PRAM packages P3 selected by CS0 of DIMM1 among the plurality of DIMMs. As such, the memory requests may be sequentially stripped on the plurality of DIMMs (DIMM0, DIMM1, DIMM2, and DIMM3). Accordingly, a memory conflict for sequential accesses can be avoided.

Further, when additional memory requests, the memory controller may stripe the additional memory request on two PRAM packages selected by the CS having a next offset (S1030). For example, the memory controller may stripe the memory request on the PRAM packages P4 selected by CS1 of DIMM0 among the plurality of DIMMs. Further, subsequent memory requests may be sequentially stripped on the PRAM packages selected by CS1 in the plurality of DIMMs (DIMM1, DIMM2, and DIMM3). Furthermore, subsequent memory requests may be served by CSs (CS2 and CS3) having next offsets.

As such, random memory requests may also be served with a minor resource conflict as addresses of the memory requests are scrambled across inter- and intra DIMMs.

In some example embodiments, each channel of the DIMMs (DIMM4 and DIMM5) allocated for non-blocking codes may be enabled when a corresponding DIMM operates in parallel. As shown in FIG. 11, a channel C0 of DIMM4 may be enabled when DIMM0 operates, a channel C1 of DIMM4 may be enabled when DIMM1 operates, a channel C2 of DIMM5 may be enabled when DIMM2 operates, and a channel C3 of DIMM4 may be enabled when DIMM3 operates. In other words, when data is stored in the PRAM packages of DIMM0, a non-blocking code corresponding to the data may be stored in a PRAM package of C0 in DIMM4. This can take read/write of the non-blocking code off a critical path of read/write of the data.

In some example embodiments, a channel selector (e.g., 716 of FIG. 7) and a chip selector (e.g., 717 of FIG. 7) may parse an address. In one example embodiment, the channel selector 716 and the chip selector 717 may parse the address for the data using a chip number and a DIMM number, and may parse the address for the non-blocking code using a chip number, a channel number, and a DIMM number.

As described above, the persistence processing apparatus may operate on the persistence memory module. However, non-persistent states managed by a cache and registers on core tiles may exist. Further, a persistence support module of the persistence processing apparatus may hold outstanding memory requests, which are not yet completely written to the persistence memory module. Hereinafter, example embodiments for changing non-persistent state information of the persistence processing apparatus to persistent are described.

Figure 12:
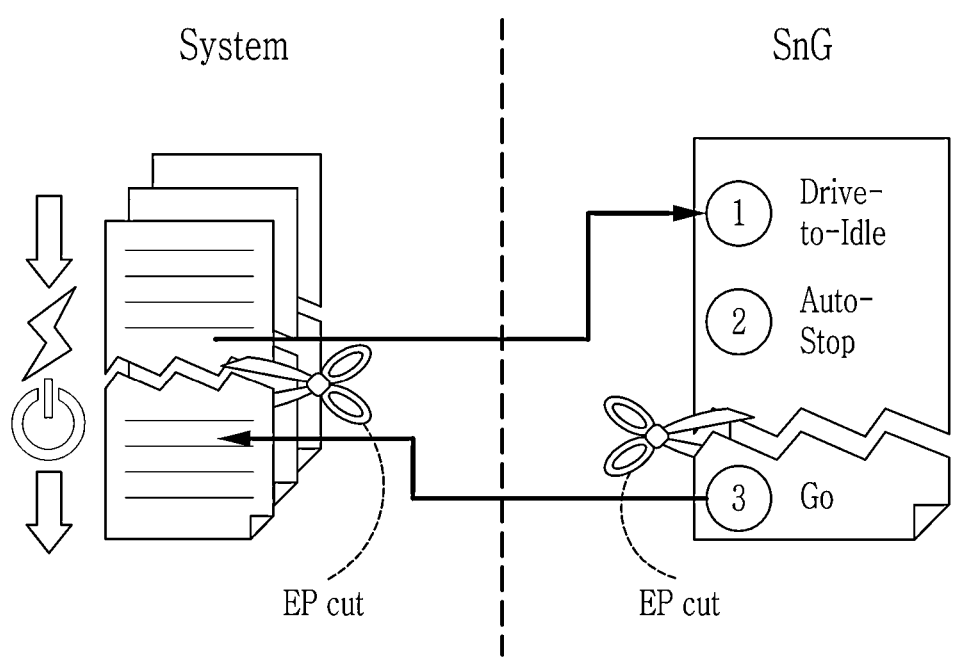
FIG. 12 and FIG. 13 are drawings showing stop and go procedures according to an example embodiment.
Figure 13:
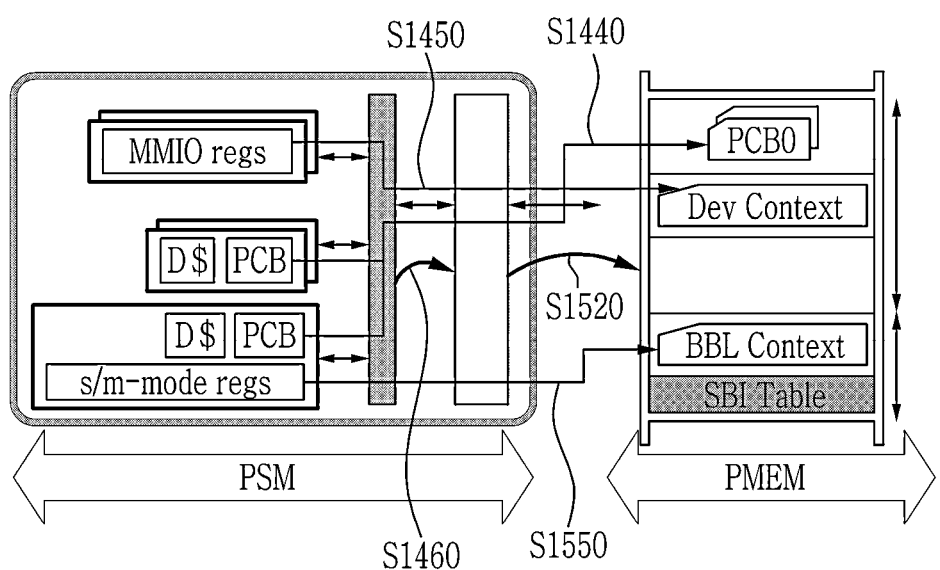
Figure 14:
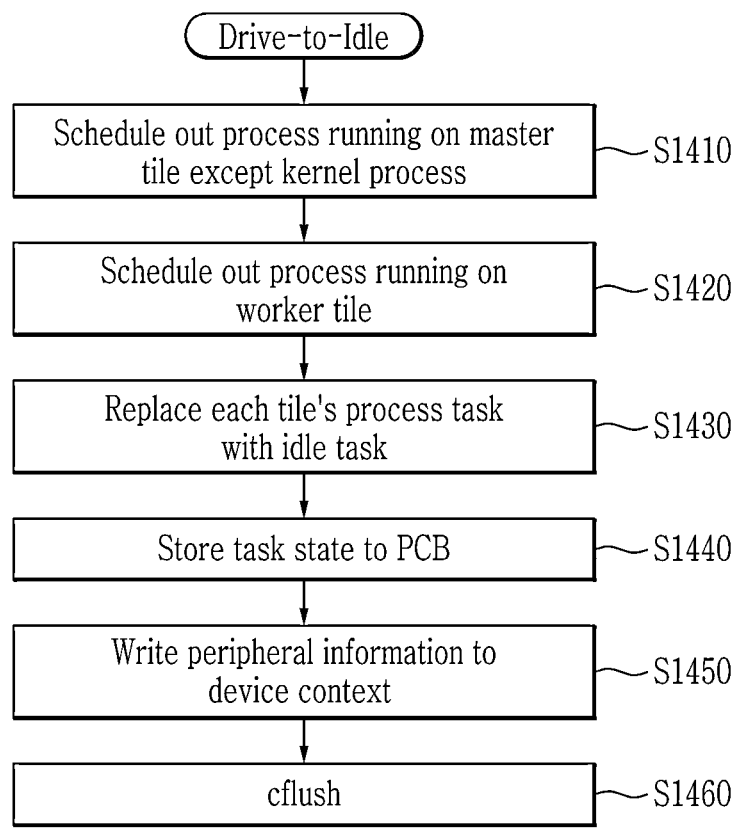
FIG. 14 and FIG. 15 are flowcharts showing a stop procedure according to an example embodiment.
Figure 15:
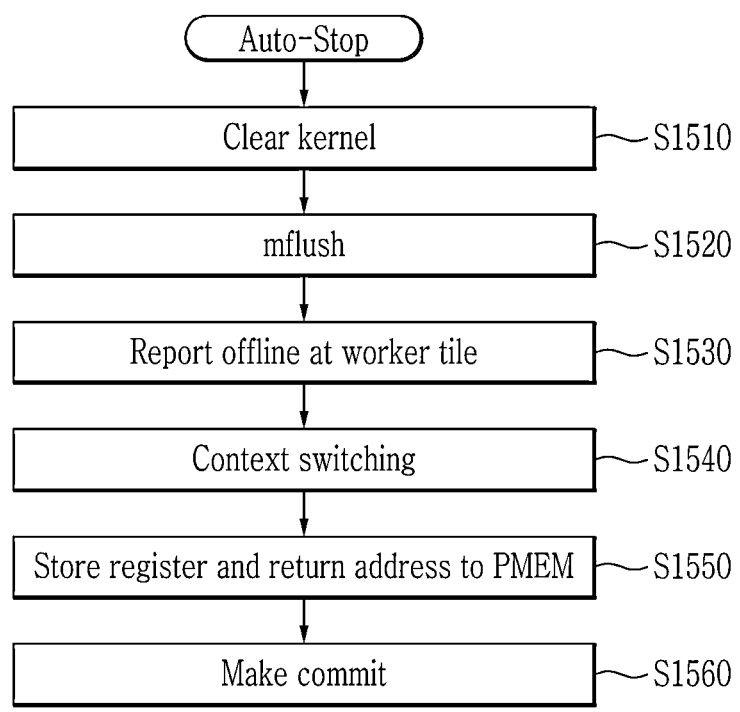
Figure 16:
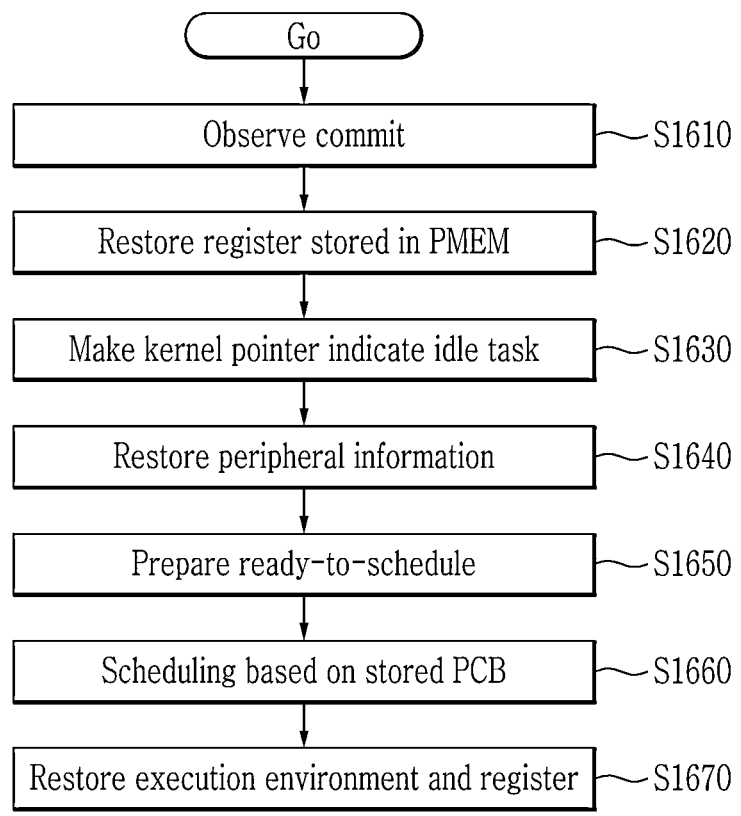
FIG. 16 is a flowchart showing a go procedure according to an example embodiment.
Figure 17:
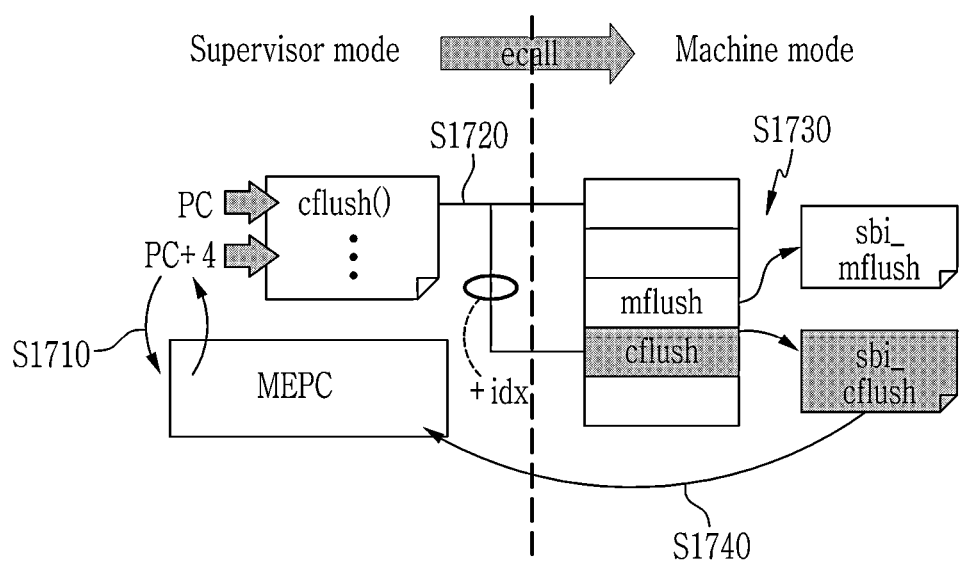
FIG. 17 is a drawing showing a flush instruction in stop and go procedures according to an example embodiment.

FIG. 12 and FIG. 13 are drawings showing stop and go procedures according to an example embodiment. FIG. 14 and FIG. 15 are flowcharts showing a stop procedure according to an example embodiment, and FIG. 16 is a flowchart showing a go procedure according to an example embodiment. FIG. 17 is a drawing showing a flush instruction in stop and go procedures according to an example embodiment.

Various example embodiments may provide a stop-and-go (SnG) method to change non-persistent state information of a persistence processing apparatus to persistent. In some example embodiments, the SnG may be provided as a set of instruction, i.e., a program. In one example embodiment, the SnG may be provided as a program of an operating system (OS)-level, for example, instruction codes included in the OS. Accordingly, an OS-level orthogonal persistence may be provided. In one example embodiment, the OS-level orthogonal persistence may be an OS-level lightweight orthogonal persistence.

Referring to FIG. 12, SnG may provide an execution persistence cut (EP-cut) where a system can safely re-execute the system without losing contents. Hereinafter, in the SnG, a procedure before the EP-cut is called a Stop procedure, and a procedure restarting the system is called a Go procedure. The SnG may be triggered by any of power failure signals of the system and change non-persistent state information to persistent.

In some example embodiments, the Stop procedure may be performed by a plurality of procedures. One procedure is a procedure of scheduling out processor tasks to make sure user and kernel processes and states persistent. Hereinafter, such a procedure is referred to as a Drive-to-Idle procedure. A subsequent procedure is a procedure of cleaning up a cache and buffer of the persistence processing apparatus and powering down core tiles. Hereinafter, such a procedure is referred to as an Auto-Stop procedure. The EP-cut may be completed by completion of the Auto-Stop procedure.

In some example embodiments, a plurality of core tiles may be classified into a master tile (e.g., the first core tile) and worker tiles. The SnG may be executed in the master tile. In some example embodiments, when a processor uses one core tile, the one core tile may operate as both the master tile and the worker tiles.

Referring to FIG. 13 and FIG. 14, in a Drive-to-Idle stage, the SnG may schedule out running processes from the master tile and the worker tile except a kernel process that implements the SnG. In some example embodiments, the SnG may immediately schedule out all processes running on the master tile except the kernel process that implements the SnG (S1410). Then, the SnG may schedule out user-level and kernel-level running processes of the worker tiles so that the processes will not change their system states (S1420). Once the SnG successfully schedules out the process tasks of the tiles, the SnG may replace each tile's running process task with an idle task (S1430). The SnG may store a state of each process task, for example, an architectural state to a corresponding process control block (PCB) (S1440). The state of the task may include a program counter and registers of threads. The process control block may be defined as a task_struct structure which is a data structure describing the process task in the Linux kernel. As described, stop at a process level can be implemented in the Drive-to-Idle stage.

Next, the SnG may read out peripheral related memory regions (e.g., memory-mapped input/output (MMIO) registers), which are not physically located to the persistence memory module but are memory-mapped. The SnG may write peripheral information to a device context that is allocated on the persistence memory module, for example, a heap of the persistence memory module (S1450). Further, the SnG may flush tile-side cache-lines to the persistence support module (S1460). In some example embodiments, the SnG may use a cflush instruction to flush the cache-lines.

In some example embodiments, differently from a traditional cache line flush instruction called "clflush", the SnG may flush all the tile-side cache-lines in a user-level without checking a memory region. That is, in the clflush instruction, after receiving a start address and size of the memory region in a system memory (persistent memory module), and then checking whether data is written to a corresponding cache line in order from the start address of the memory region, if the data is written, the corresponding cache line is flushed. Accordingly, so the larger an address region designated by the start address and size is, the longer an execution time of the instruction is. However, in the cflush instruction, the tile-side cache-lines can be sequentially flushed without receiving an address region (start address and size) of the memory region. As such, since the flush is performed without checking the memory region, the flush can be performed in short time.

As described above, in the Drive-to-Idle stage, stop at a device level can be implemented.

Referring to FIG. 13 and FIG. 15, after the Drive-to-Idle stage, the SnG may perform an Auto-Stop stage. The Auto-Stop stage is a power down process in which the SnG can power down the core tiles. In some example embodiments, the master tile may set a flag to inform that the system is now in the power down process. In one example embodiment, the master tile may set a flag per core tile. As described above, the worker tiles are executing their own idle task, and the idle task may be referred by a kernel point, for example, a kernel task pointer and a kernel stack pointer (e.g., _cpu_up_stack_pointer and _cpu_up_task_pointer). The kernel pointer may be referred again at a Go stage before notifying an availability of a corresponding worker tile to the master tile. If the master tile misses the notification in the Go stage, the master tile may keep waiting for the notification before moving further, which may make a kernel panic. Therefore, in some example embodiments, in the Auto-Stop stage, the SnG may clear the kernel pointer (S1510). Thus, all the tiles of the persistence processing apparatus can be correctly synchronized after the system is powered on. In some example embodiments, the SnG may flush cache lines of each tile again. Further, the SnG may complete pending memory requests in the persistence support module by communicating with each tile and flushing the pending memory requests and cache data (S1520). In some example embodiments, the SnG may use an mflush instruction for the flush in the persistence support module.

In a last process of power down from the worker tile viewpoint, the worker tile may report that the worker tile itself is ready to be offline to the master tile and power off (S1530). If the master tile receives the offline reports from all the worker tiles (S1530), the SnG may store registers associated with the SnG (S1550). In some example embodiments, the SnG may store the registers to be used for a re-execute process of the SnG to the persistence memory module (S1550). In some example embodiments, the SnG may store the registers to be used for the re-execute process of the SnG to a reserved area of the persistence memory module.

In some example embodiments, the registers, such as interrupt configuration and CPU mode information, to be used for the re-execute process of the SnG may be prohibited to access in a kernel mode such as a supervisor mode. In this case, context switching may be performed to make the master tile offline. Accordingly, if the master tile receives the offline reports from all the worker tiles (S1530), the master tile may raise a system-level exception to switch the context from a kernel to bootloader (S1540). The bootloader may be an executable, i.e., a program that processes a set of operations prohibited in kernel mode in a protection mode that runs machine-specific firmware. In some example embodiments, the protection mode may be a machine mode, and the bootloader may be Berkeley boot loader (BBL). Hereinafter, the bootloader is described as the BBL.

Accordingly, the BBL-side SnG may store the master tile's registers (e.g., a supervisor mode register and a machine mode register (s/m-registers)) associated with the kernel-side SnG to a reserved area of the persistence memory module, called BBL context (S1550). Further, the BBL-side SnG may store registers that the BBL has used and a return address, called a machine exception program counter (MEPC), where the Go stage will re-execute a system to the BBL context (S1550).

Furthermore, the SnG may execute a commit at a final stage and flush a commit flag to the persistence memory module in order to check up whether the Drive-to-Idle stage and the Auto-Stop stage are successfully completed when the system is powered on again (S1560). In some example embodiments, the mflush instruction may be used for the commit flag.

In some example embodiments, the Stop stage may be performed by standby power remaining in a processor such as a CPU after the power failure event of the system.

Next, in the Go stage, the persistence processing apparatus may check the commit flag to figure out what the system needs to operate when the system is powered on and the power is recovered. Referring to FIG. 16, if a commit made in the Auto-Stop stage is observed (S1610), SnG may restore registers stored in a persistence memory module (S1620).

In some example embodiments, the SnG may restore BBL-related registers, machine mode registers, and kernel registers into a master tile. During this time, the master tile may configure interrupt and delegation information by reading BBL context stored in the Auto-Stop stage. The delegation means boosting a tile's supervisor mode to a machine mode for a specific operation such as external interrupt and software interrupt trap handlers. Since an MEPC restored from the BBL context indicates an EP-cut that kernel-side SnG re-executes, a control may be passed from BBL-side SnG to kernel after the BBL-side SnG completes a task.

Then, the master tile may power on worker tiles and reconfigure all the registers of target tiles. In some example embodiments, once the target tiles are ready to run, the target tiles may keep checking a kernel pointer (e.g., _cpu_up_stack_pointer and _cpu_up_task_pointer) to place a working task. Since the kernel point is cleared in the Auto-Stop stage, the SnG may make the kernel point indicate an idle task by referring to a kernel heap of the persistence memory module. At this juncture, the SnG may return the system state from a Stop state to an Idle state. As such, the master tile may operate on the SnG while all the worker tiles are in idle. Then, the master tile may restore peripheral information (e.g., MMIO registers) by reading a device context from the persistence memory module (S1640). Then, the master and worker tiles may prepare ready-to-schedule by restoring a virtual memory space and flushing translation look-aside buffer (TLB) (S1650).

Finally, the SnG may schedule process tasks based on the process control blocks stored in the Drive-to-Idle stage (S1660). In some example embodiments, the SnG may schedule kernel process tasks in first and then user-level process tasks. Since the process control blocks that the SnG has stored in the Drive-to-Idle stage include execution environment and registers, the SnG may restore the execution environment and registers and load the virtual address space to a memory-management unit (MMU) per process when a kernel scheduler makes process tasks to run (S1670). Accordingly, the processes can exactly re-execute a point where the EP-cut indicates again.

In some example embodiments, an instruction (cflush or mflush) that the persistence processing apparatus implements may be used to flush tile-level caches and/or a buffer of the persistence support module. In some example embodiments, as a kernel can run on a kernel mode (e.g., supervisor mode) which cannot access any regions protected by a protection mode (e.g., machine mode), kernel-level SnG may not flush tile's cache-lines and the buffer residing in a memory controller of the persistence support module. Accordingly, to issue such an instruction directly to the tile, the SnG may be executed in the machine mode. In some example embodiments, a table for a system call may be provided to issue the instruction to the tile. In one example embodiment, the table may be a table for an interface between the machine mode and the supervisor mode. In one example embodiment, the table may be implemented by modifying a supervisor binary interface (SBI). Hereinafter, the table is referred to as an "SBI table". In some example embodiments, the SBI table may be stored in the persistence memory module.

An SBI table entry may include a handler location (pointer) that exists in bootloader (e.g., BBL), and a corresponding index may be used for a kernel to call. Thus, two handlers associated with cflush and mflush respectively may be added. Hereinafter, the handler associated with cflush is referred to as sbi_cflush, and the handler associated with mflush is referred to as sbi_mflush. Similar to system calls, the kernel-level SnG may raise an exception by issuing an exception call (ecall). When issuing the exception call, the kernel may store an index for the cache flush handler (sbi_cflush) of the SBI table, and argument to indicate whether flushing a cache-line or the entire cache. To make sure all pending memory requests are completed, the kernel may simply store an index for the BBL-side memory flush handler (sbi_mflush). Once the exception arises, a CPU mode may be changed from the supervisor mode to the machine mode as the exception handler is located at the BBL. The exception handler may retrieve a pointer of sbi_cflush or sbi_mflush, based on an index that the kernel stores, and issue cflush or mflush. Since the BBL is visible for all the tiles, each tile may flush the cache and/or buffer appropriately.

For example, as shown in FIG. 17, in the Stop stage, the SnG may store a program counter (PC+4) after an instruction size (e.g., 4 bytes) from a current program counter (PC), to an MEPC (S1710). When the exception arises, the SnG may look up the SBI table based on the stored index (idx) (S1720), and perform the handler corresponding to the index to execute a flush instruction (S1730). Then, in the Go stage, the SnG may move to the program counter (PC+4) stored in the MEPC (S1740).

According to example embodiments described above, because non-persistent state information such as states of process tasks and peripheral information can be changed to persistent upon the power failure event, all the stopped user and kernel process tasks on the processor can be immediately executed when the power is recovered.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of supporting persistence of a computing device including a processor and a memory module including a non-volatile memory, the method comprising:
    performing a stop procedure upon power failure, wherein the step of performing the stop procedure comprises
    scheduling out a running process task,
    storing a state of the process task to a process control block of the memory module,
    flushing a cache for the processor, and
    flushing a pending memory request;
    wherein the processor includes a plurality of core tiles including a master tile and a worker tile, and
    wherein the scheduling out the running process task comprises:
    scheduling out a process task running on the master tile except a kernel process implementing the stop procedure; and
    scheduling out a process task running on the worker tile.

2. The method of claim 1, further comprising performing a go procedure when power is recovered,
    wherein the performing the go procedure comprises scheduling process tasks based on the process control block.

3. The method of claim 2, wherein the performing the stop procedure further comprises storing a register associated with a program for performing the stop procedure and the go procedure to the memory module.

4. The method of claim 3, wherein the performing the go procedure further comprises restoring the register from the memory module.

5. The method of claim 1, wherein the performing the stop procedure further comprises:
    reading peripheral information from a peripheral related memory region; and
    writing the peripheral information to a device context of the memory module.

6. The method of claim 5, further comprising performing a go procedure when power is recovered,
    wherein the performing the go procedure comprises restoring the peripheral information by reading the device context.

7. The method of claim 1, wherein the performing the stop procedure comprises, after flushing the pending memory request;
    reporting offline to the master tile and powering off, at the worker tile; and
    switching a context at the master tile when receiving the offline report from the worker tile.

8. The method of claim 7, wherein the switching the context comprises raising a system-level exception to switch the context from a kernel to bootloader of a protection mode.

9. The method of claim 8, wherein the performing the stop procedure comprises, in the protection mode, storing a return address for re-executing a system to the memory module.

10. The method of claim 1, wherein the performing the stop procedure comprises:
    raising a system-level exception to switch a context from a kernel to bootloader of a protection mode; and
    executing a first flush instruction for flushing the cache and a second flush instruction for flushing the memory request in the protection mode.

11. The method of claim 1, wherein the flushing the cache comprises flushing the cache in a user-level without checking a memory region of the memory module.

12. A method of supporting persistence of a computing device including a processor and a memory module including a non-volatile memory, the method comprising:
    performing a stop procedure upon power failure, wherein the step of performing the stop procedure comprises
    scheduling out a running process task,
    storing a state of the process task to a process control block of the memory module,
    flushing a cache for the processor, and
    flushing a pending memory request, wherein the step of scheduling out the running process task comprises replacing the running process task with an idle task; and
    wherein the performing the stop procedure comprises clearing a kernel pointer of referring to the idle task.

13. The method of claim 12, further comprising performing a go procedure when power is recovered,
    wherein the performing the go procedure comprises scheduling process tasks based on the process control block after returning the kernel pointer to an idle task.

* * * * *